United States Patent
Brown et al.

(10) Patent No.: US 10,050,115 B2
(45) Date of Patent: Aug. 14, 2018

(54) TAPERED GATE OXIDE IN LDMOS DEVICES

(71) Applicant: INTERNATIONAL BUSINESS MACHINES CORPORATION, Armonk, NY (US)

(72) Inventors: Brennan J. Brown, Burlington, VT (US); Natalie B. Feilchenfeld, Jericho, VT (US); Max G. Levy, Essex Junction, VT (US); Santosh Sharma, Essex Junction, VT (US); Yun Shi, South Burlington, VT (US); Michael J. Zierak, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 227 days.

(21) Appl. No.: 14/585,933

(22) Filed: Dec. 30, 2014

(65) Prior Publication Data
US 2016/0190269 A1 Jun. 30, 2016

(51) Int. Cl.
*H01L 29/78* (2006.01)
*H01L 29/66* (2006.01)
(Continued)

(52) U.S. Cl.
CPC .... *H01L 29/42368* (2013.01); *H01L 29/0649* (2013.01); *H01L 29/66659* (2013.01);
(Continued)

(58) Field of Classification Search
CPC ........... H01L 29/66681; H01L 29/7816; H01L 29/7835; H01L 29/66659; H01L 29/0649; H01L 29/42368
See application file for complete search history.

(56) References Cited

U.S. PATENT DOCUMENTS

| 4,713,681 A | 12/1987 | Beasom |
| 6,468,870 B1 * | 10/2002 | Kao ................. H01L 21/28194 |
| | | 257/E21.417 |

(Continued)

FOREIGN PATENT DOCUMENTS

| CN | 103035727 | 4/2013 |
| DE | 102006033692 A1 | 1/2008 |

(Continued)

OTHER PUBLICATIONS

Kim et al., "Characteristics of P-channel SOI LDMOS Transistor with Tapered Field Oxides," ETRI Journal, vol. 21, No. 3, Sep. 1999. pp. 22-28.*

(Continued)

*Primary Examiner* — Jarrett Stark
*Assistant Examiner* — Charles N Ausar-El
(74) *Attorney, Agent, or Firm* — Michael LeStrange; Andrew M. Calderon; Roberts Mlotkowski Safran Cole & Calderon, P.C.

(57) ABSTRACT

Approaches for LDMOS devices are provided. A method of forming a semiconductor structure includes forming a gate dielectric including a first portion having a first uniform thickness, a second portion having a second uniform thickness different than the first uniform thickness, and a transition portion having tapered surface extending from the first portion to the second portion. The gate dielectric is formed on a planar upper surface of a substrate. The tapered surface is at an acute angle relative to the upper surface of the substrate.

10 Claims, 11 Drawing Sheets

(51) Int. Cl.
*H01L 29/06* (2006.01)
*H01L 29/423* (2006.01)

(52) U.S. Cl.
CPC .... *H01L 29/66681* (2013.01); *H01L 29/7816* (2013.01); *H01L 29/7835* (2013.01)

(56) References Cited

U.S. PATENT DOCUMENTS

| | | | | |
|---|---|---|---|---|
| 6,657,276 B1* | 12/2003 | Karlsson | ........... | H01L 21/76264 257/506 |
| 6,762,457 B2 | 7/2004 | Pearce et al. | | |
| 6,858,532 B2 | 2/2005 | Natzle et al. | | |
| 7,056,785 B2* | 6/2006 | Hsu | ........... | G11C 7/20 257/E21.209 |
| 7,554,154 B2* | 6/2009 | Hebert | ........... | H01L 29/4175 257/340 |
| 7,683,427 B2* | 3/2010 | Chen | ........... | H01L 29/42368 257/343 |
| 7,719,054 B2* | 5/2010 | Williams | ........... | H01L 21/761 257/335 |
| 7,795,674 B2 | 9/2010 | Yang et al. | | |
| 7,829,945 B2 | 11/2010 | Adkisson et al. | | |
| 8,101,479 B2 | 1/2012 | Parker et al. | | |
| 8,174,071 B2 | 5/2012 | Tien et al. | | |
| 8,450,802 B2 | 5/2013 | De Boet et al. | | |
| 8,546,883 B2* | 10/2013 | Cha | ........... | H01L 29/0878 257/335 |
| 8,878,275 B2* | 11/2014 | Kim | ........... | H01L 29/66681 257/310 |
| 8,994,103 B2* | 3/2015 | Chen | ........... | H01L 29/7816 257/335 |
| 9,012,988 B2* | 4/2015 | Chen | ........... | H01L 29/7816 257/337 |
| 9,219,146 B2* | 12/2015 | Yoo | ........... | H01L 29/7816 |
| 9,236,469 B2* | 1/2016 | Pan | ........... | H01L 29/7816 |
| 9,287,394 B2* | 3/2016 | Huang | ........... | H01L 29/7816 |
| 9,318,366 B2* | 4/2016 | Chou | ........... | H01L 21/76205 |
| 9,466,715 B2* | 10/2016 | Cheng | ........... | H01L 29/7833 |
| 2003/0173624 A1* | 9/2003 | Choi | ........... | H01L 29/1095 257/368 |
| 2004/0222488 A1* | 11/2004 | Abadeer | ........... | H01L 29/0653 257/510 |
| 2004/0251492 A1* | 12/2004 | Lin | ........... | H01L 29/7816 257/335 |
| 2004/0262685 A1 | 12/2004 | Zingg | | |
| 2005/0062125 A1* | 3/2005 | Kitaguchi | ........... | H01L 29/0619 257/492 |
| 2005/0090073 A1 | 4/2005 | Hawley et al. | | |
| 2008/0023785 A1 | 1/2008 | Hebert | | |
| 2008/0153239 A1 | 6/2008 | Su et al. | | |
| 2008/0246086 A1 | 10/2008 | Korec et al. | | |
| 2009/0072308 A1* | 3/2009 | Chen | ........... | H01L 29/42368 257/336 |
| 2009/0166736 A1* | 7/2009 | Park | ........... | H01L 29/4236 257/343 |
| 2009/0230468 A1* | 9/2009 | Cai | ........... | H01L 21/823412 257/337 |
| 2009/0261426 A1* | 10/2009 | Feilchenfeld | ........... | H01L 21/26513 257/408 |
| 2010/0102388 A1* | 4/2010 | Levin | ........... | H01L 21/823418 257/343 |
| 2010/0301411 A1* | 12/2010 | Takeda | ........... | H01L 29/0696 257/335 |
| 2011/0241108 A1* | 10/2011 | Zuniga | ........... | H01L 29/42368 257/337 |
| 2012/0228705 A1* | 9/2012 | Toh | ........... | H01L 29/42368 257/339 |
| 2012/0280319 A1* | 11/2012 | Roehrer | ........... | H01L 29/0653 257/337 |
| 2013/0119466 A1 | 5/2013 | Chung et al. | | |
| 2013/0181287 A1 | 7/2013 | Zhang et al. | | |
| 2013/0256698 A1 | 10/2013 | Sdrulla et al. | | |
| 2014/0008723 A1* | 1/2014 | Lin | ........... | H01L 29/0634 257/336 |
| 2014/0131796 A1 | 5/2014 | Zhou et al. | | |
| 2014/0231911 A1* | 8/2014 | Kim | ........... | H01L 29/66681 257/339 |
| 2014/0252499 A1* | 9/2014 | Lin | ........... | H01L 29/42368 257/408 |
| 2014/0327084 A1* | 11/2014 | Feilchenfeld | ........... | H01L 29/0653 257/372 |
| 2014/0346596 A1* | 11/2014 | Ellis-Monaghan | ........... | H01L 29/66681 257/335 |
| 2014/0346597 A1* | 11/2014 | Feilchenfeld | ........... | H01L 29/7816 257/339 |
| 2015/0048447 A1* | 2/2015 | Sharma | ........... | H01L 29/7816 257/337 |
| 2015/0061011 A1* | 3/2015 | Cheng | ........... | H01L 29/7833 257/344 |
| 2015/0108503 A1* | 4/2015 | Kudou | ........... | H01L 29/0611 257/77 |
| 2015/0187933 A1* | 7/2015 | Lin | ........... | H01L 29/7816 257/339 |
| 2015/0243766 A1* | 8/2015 | Tu | ........... | H01L 29/66681 257/329 |
| 2015/0311339 A1* | 10/2015 | Toyoda | ........... | H01L 29/7835 257/334 |
| 2015/0318378 A1* | 11/2015 | Letavic | ........... | H01L 29/78 257/343 |
| 2016/0035883 A1* | 2/2016 | Hao | ........... | H01L 29/7816 257/339 |
| 2016/0099346 A1* | 4/2016 | Yang | ........... | H01L 29/7816 257/339 |
| 2016/0126313 A1* | 5/2016 | Mimuro | ........... | H01L 29/42368 257/339 |
| 2016/0172490 A1* | 6/2016 | Lao | ........... | H01L 21/28052 257/408 |
| 2017/0054019 A1* | 2/2017 | Huang | ........... | H01L 29/1095 |

FOREIGN PATENT DOCUMENTS

| | | |
|---|---|---|
| DE | 102006033692 B4 | 1/2011 |
| WO | 9833218 | 7/1998 |
| WO | 2004102672 A1 | 11/2004 |

OTHER PUBLICATIONS

U.S. Appl. No. 14/269,599, filed May 5, 2014.
Office Action dated Jul. 9, 2015 in U.S. Appl. No. 14/269,599; 10 pages.
Bulucea, C. "Physics, Technology, and Modeling of Complementary Asymmetric MOSFETs", IEEE Transactions on vol. 57, Issue: 10, 2010, pp. 2363-2380
Weifeng, S. "High-Voltage Power IC Technology With nVDMOS, RESURF pLDMOS, And Novel Level-Shift Circuit For PDP Scan-Driver IC", IEEE Transactions on vol. 53, Issue: 4, 2006, pp. 891-896.
"List of IBM Patents or Patent Applications Treated as Related" submitted here with; 1 page.
Ludikhuize, "High-Voltage DMOS and PMOS in Analog IC's," published in the1982 IEDM proceedings, 9 pages.
U.S. Appl. No. 14/269,599, filed May 5, 2014, 30 pages, not yet published.
Notice of Allowance dated Feb. 5, 2016 in U.S. Appl. No. 14/269,599; 8 pages.
Office Action from related Taiwan Patent Application No. 104141272 dated Nov. 15, 2016, 20 pages.
Office Action from related Chinese Patent Application No. 201511021306.6 dated Jan. 4, 2018, 7 pages.

* cited by examiner

TAPERED GATE OXIDE IN LDMOS DEVICES

FIELD OF THE INVENTION

The invention relates to semiconductor structures and, more particularly, to laterally diffused metal oxide semiconductor (LDMOS) devices having a tapered gate oxide and methods of manufacture.

BACKGROUND

A laterally diffused metal oxide semiconductor (LDMOS) field effect transistor (FET) is a transistor having a drift region between a gate and a drain region in order to avoid a high electric field at a drain junction, i.e., at the p-n junction between a body and the drain region. An LDMOS device is typically employed in high voltage power applications involving voltages in the range from about 5 V to about 200 V, which is applied across the drain region and the source region. A substantial fraction of the high voltage may be consumed within the drift region in the LDMOS device so that the electric field generated across the gate dielectric does not cause breakdown of the gate dielectric.

Voltage breakdown and hot carrier shifting can occur in various locations within high voltage devices, such as high voltage LDMOS devices. These mechanisms are driven by high electric fields, high current densities, and the interaction of the two. High electric fields mainly occur in at p-n junctions and locations of sharp corners in the structure of a high voltage device.

A field plate comprised of gate oxide and polysilicon is often used to reduce the electric field in the drift region. However, the field plate introduces an additional discontinuity in the device at the drain edge of the field plate. To enhance the action of the field plate and provide improved breakdown voltage margin at the drain, a step oxide configuration is sometimes used. In a step oxide configuration there, is a sharp vertical discontinuity (i.e., a step) at the transition point between a first region of a gate oxide having a first thickness and a second region of the gate oxide having a second thickness. The sharp discontinuity results in a large electric field that is in the current path which can drive hot carrier degradation as well as voltage breakdown.

SUMMARY

In a first aspect of the invention, there is a method of forming a semiconductor structure. The method includes forming a gate dielectric including a first portion having a first uniform thickness, a second portion having a second uniform thickness different than the first uniform thickness, and a transition portion having tapered surface extending from the first portion to the second portion. The gate dielectric is formed on a planar upper surface of a substrate. The tapered surface is at an acute angle relative to the upper surface of a substrate.

In another aspect of the invention, there is a method of forming a semiconductor structure. The method includes: forming a first well in a substrate, and forming a second well in the substrate and abutting the first well, wherein an upper surface of the first well and an upper surface of the second well are coplanar with an upper surface of the substrate. The method also includes forming a gate dielectric comprising a thin portion on the upper surface of the first well, a thick portion on the upper surface of the second well, and a transition portion having tapered surface extending from the thin portion to the thick portion. The method further includes: forming a gate conductor on the gate dielectric; forming a source region abutting the first well; and forming a drain region abutting the second well.

In another aspect of the invention, there is a semiconductor structure including a gate dielectric including: a first portion having a first planar upper surface and first uniform thickness; a second portion having a second planar upper surface and a second uniform thickness different than the first uniform thickness; and a transition portion having tapered surface extending from the first portion to the second portion. The gate dielectric is on a planar upper surface of a substrate. The tapered surface is at an acute angle relative to the upper surface of a substrate.

In another aspect of the invention, there is a semiconductor structure including: a channel region in a first well in a substrate; a drift region in a second well in the substrate; a source region in the substrate and abutting the channel region; and a drain region in the substrate and abutting the drift region. The structure includes a gate dielectric including: a thin portion on the channel region; a thick portion on the drift region; and a transition region having tapered surface extending from the thin portion to the thick portion. The gate dielectric is on a planar upper surface of the substrate. The tapered surface is at an acute angle relative to the upper surface of a substrate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
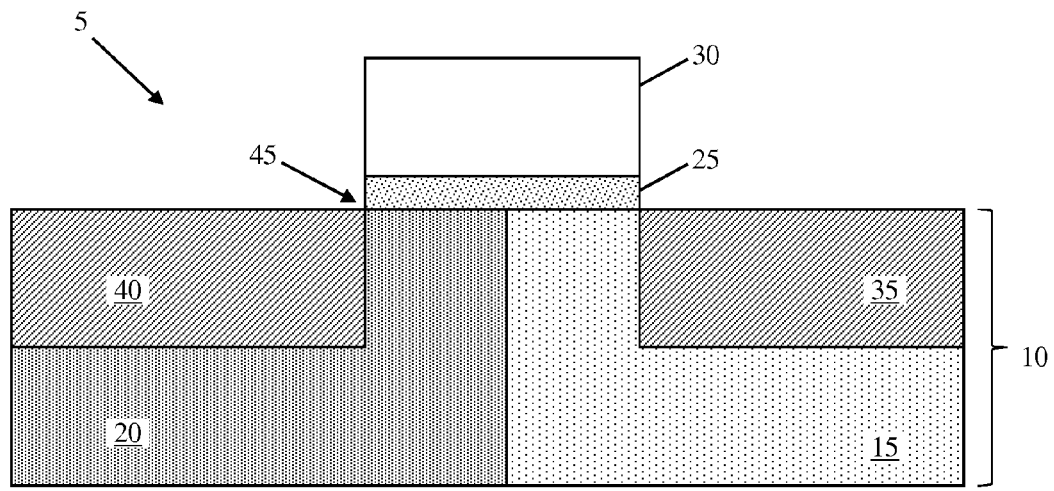
FIGS. 1 and 2 show LDMOS devices.

The invention relates to semiconductor structures and, more particularly, to laterally diffused metal oxide semiconductor (LDMOS) devices having a tapered gate oxide and methods of manufacture. According to aspects of the invention, an LDMOS device is provided with a gate oxide having a thick region, a thin region, and a tapered region between the thick region and the thin region. In embodiments, the angle of the upper surface of the tapered region is controlled using etch process parameters to achieve a desired angle. In this manner, implementations of the invention provide an LDMOS device having a tapered gate oxide.

According to aspects of the invention, the electric field is reduced at the transition region between thin and thick gate oxide regions by tapering the transition of the thickness of the gate oxide over some lateral distance. The tapering reduces the discontinuity in the electric field as it is spread out over the lateral distance. The reduction in electric field varies as the angle of the taper decreases from 90 degrees.

The largest benefit occurs in the initial reduction from 90 degrees and approaches zero as the angle approaches 0 degrees. The amount of taper that is beneficial is limited by the final oxide thickness at the drain end of the gate. Depending on the drift region doping profile, there is a maximum taper beyond which the voltage breakdown of the device begins to drop due to oxide thinning near the drain end of the gate. Controlling the taper angle as described herein provides for improved hot carrier reliability while still maintaining the breakdown voltage (VBD) of the device.

In accordance with aspects of the invention, there is a device (e.g., a high voltage LDMOS device) comprising: a gate oxide formed on a planar surface of a substrate, the gate oxide having a first thickness and a second thickness; and a transition region between the first thickness and the second thickness comprising a slope less than 90 degrees (as opposed to a vertical step). In embodiments, the slope is tuned using oxide etching (e.g., wet etch) to obtain a predetermined gate oxide breakdown voltage according to the device's drift region doping profile. In embodiments, the first thickness is greater than the second thickness, wherein the first thickness is formed over a drift region of an LDMOS and the second thickness is formed over a channel region. In embodiments, the first thickness and the second thickness each has a uniform thickness outside of the transition region (rather than an increasing or decreasing thickness in the regions of the first thickness and the second thickness). Aspects of the invention also include a method of manufacturing such a device.

The structures of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition and/or growth of thin films of material on a substrate, (ii) applying a patterned mask on top of the films by photolithographic imaging, and (iii) etching the films selectively to the mask.

FIG. 1 shows an LDMOS device 5 comprising a semiconductor substrate 10 in which a first well 15 and a second well 20 are formed. A gate comprising a gate dielectric 25 and a gate conductor 30 is formed straddling the interface between the first well 15 and the second well 20. A source region 35 is formed in the first well 15, and a drain region 40 is formed in the second well 20. The LDMOS device 5 may comprise an n-type field effect transistor (NFET) when the first well 15 is doped with a p-type impurity, the second well 20 is doped with an n-type impurity, and the source region 35 and drain region 40 are heavily doped with an n-type impurity (e.g., N+).

As shown in FIG. 1, the gate dielectric 25 has a substantially uniform thickness for the entirety of the gate structure. The sharp corner 45 at the edge of the gate dielectric 25 on the drain side of the device results in the occurrence of a high electric field that can negatively affect breakdown voltage and hot carrier shifting in the device 5.

Figure 2:
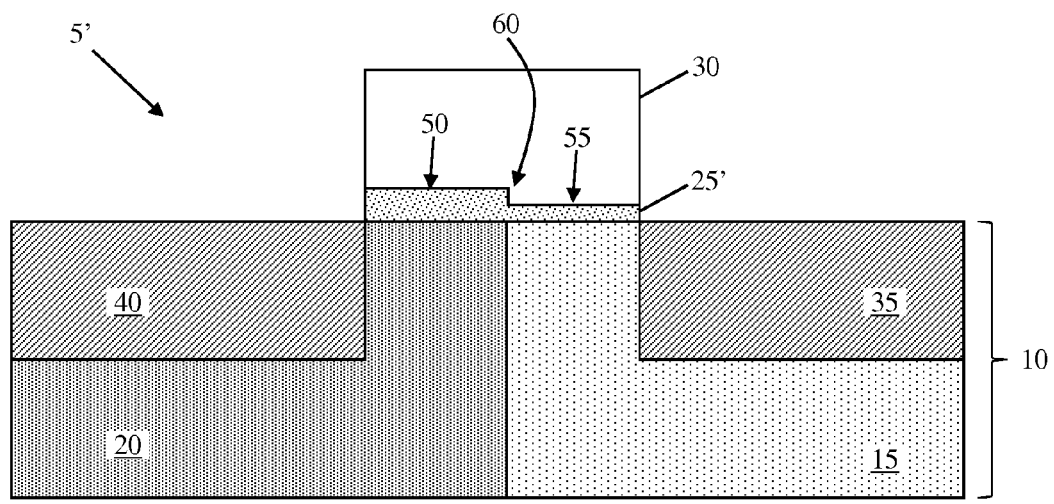

FIG. 2 shows an LDMOS device 5' comprising a first well 15, second well 20, gate conductor 30, source region 35 and drain region 40 similar to that of FIG. 1. In the device 5' of FIG. 2, the gate dielectric 25' comprises a thick region 50 at the drain side and a thin region 55 at the source side. A step 60, i.e., a substantially vertical wall, is present at the transition from the thick region 50 to the thin region 55. A thin gate dielectric is preferred on the source side of a gate electrode to apply a strong electric field to induce current flow, while a thick gate dielectric is preferred on the drain side of the gate electrode to prevent an excessive electric field across the gate oxide in an LDMOS device. However, the sharp transition (i.e., corner) at the step 60 results in the occurrence of a high electric field that can negatively affect breakdown voltage and hot carrier shifting in the device 5'.

Figure 3:
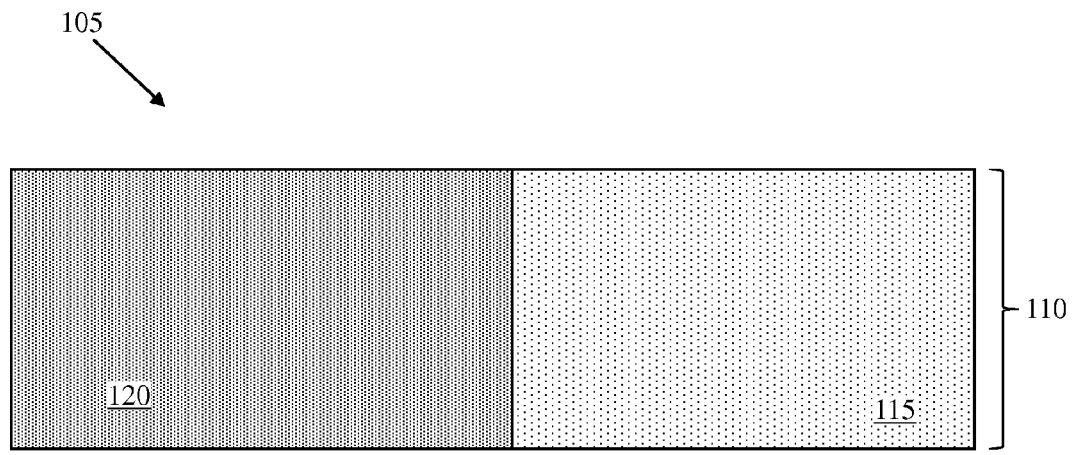
FIGS. 3-11 show structures and respective processing steps in accordance with aspects of the invention.

FIGS. 3-11 show structures and respective processing steps in accordance with aspects of the invention. In particular, FIG. 3 shows a semiconductor structure 105 comprising a region of a substrate 110 in which a first well 115 and a second well 120 are formed. The first well 115 is doped with a first conductive type impurity, and the second well 120 is doped with a second conductive type impurity. For example, for forming an NFET LDMOS device, the substrate 110 may be a P-type substrate, the first well 115 may be doped with p-type doping, and the second well 120 may be doped with n-type doping. The substrate 110 may be a bulk semiconductor material substrate, such as a bulk silicon substrate. Alternatively, as described with respect to FIG. 14, aspects of the invention may be implemented using alternatives to bulk silicon, such as silicon-on-insulator (SOI), silicon on sapphire, gallium nitride, and silicon nitride substrates.

The first well 115 and second well 120 may be formed using conventional semiconductor manufacturing processes, such as masking and ion implantation. The first well 115 may have a dopant concentration from about $1.0 \times 10^{16}/cm^3$ to about $3.0 \times 10^{19}/cm^3$, and typically from about $3.0 \times 10^{16}/cm^3$ to about $1.0 \times 10^{19}/cm^3$, although lesser and greater dopant concentrations are also contemplated herein. Similarly, the second well 120 may have a dopant concentration from about $1.0 \times 10^{16}/cm^3$ to about $3.0 \times 10^{19}/cm^3$, and typically from about $3.0 \times 10^{16}/cm^3$ to about $1.0 \times 10^{19}/cm^3$, although lesser and greater dopant concentrations are also contemplated herein. Preferably, the dopant concentration of the first well 115 is greater than the dopant concentration of the substrate 110. The first well 115 laterally abuts the second well 120. The depth of the first well 115 may be greater than, or may be substantially the same as, the depth of the second well 120. Typically, the depths of the first well 115 and the second well 120 are from about 100 nm to about 1500 nm.

Figure 4:
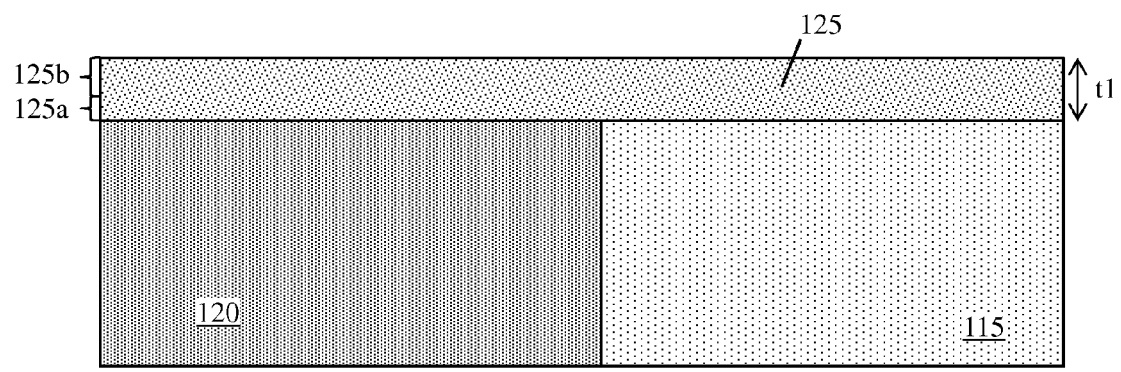

As shown in FIG. 4, a first layer 125 of dielectric material is formed on the upper surfaces of the first well 115 and the second well 120. The first layer 125 spans the interface between the first well 115 and the second well 120. In embodiments, the first layer 125 comprises oxide that is thermally grown and/or deposited. For example, the first layer 125 may comprise $SiO_2$ that is grown using a conventional thermal oxidation process. In another example, the first layer 125 may comprise tetraethoxysilane (TEOS) oxide that is deposited using low pressure chemical vapor deposition (LPCVD). In another example, the first layer 125 may include a thin layer 125a of thermally grown oxide ($SiO_2$) formed on the upper surfaces of the first well 115 and the second well 120, and a thick layer 125b of deposited oxide (e.g., TEOS) formed on the upper surface of the thin layer 125a.

Still referring to FIG. 4, the thickness t1 of the layer of first layer 125 may be selected based on a combination of (i)

the etch process that is subsequently used to form a sloped transition surface of the first layer 125 and (ii) the desired slope of the transition surface. For thermally grown oxide, the thickness t1 may be in a range of about 15-250 Angstroms (Å), although other thickness may be used. For deposited oxide, the thickness t1 may be in a range of about 200-600 Å, although other thickness may be used.

Figure 5:
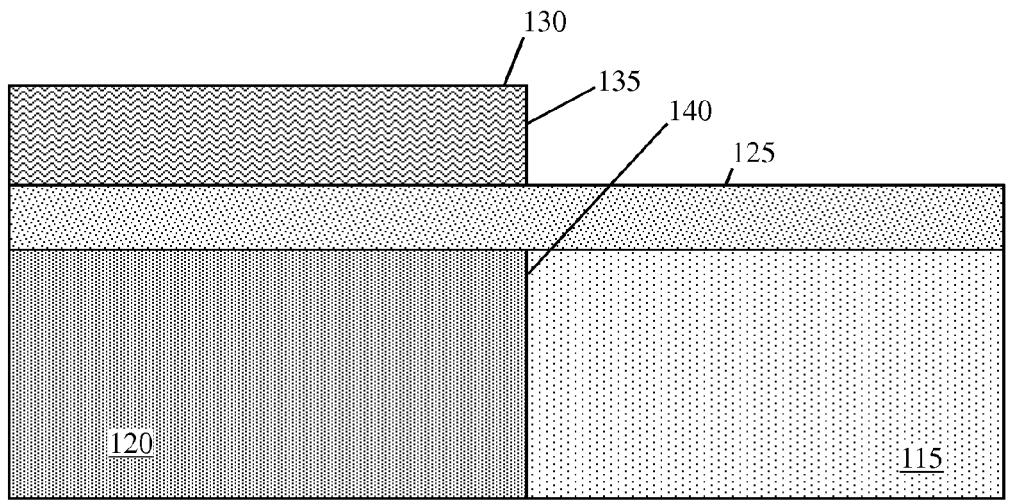

As shown in FIG. 5, a mask 130 is formed on the upper surface of the first layer 125. The mask 130 may be formed using conventional processes, such as: applying a photoresist material on the first layer 125, exposing the photoresist to a desired pattern of radiation, and developing the exposed photoresist utilizing a resist developer. In embodiments, the mask 130 is patterned such that an edge 135 of the mask 130 is aligned with the interface 140 between the first well 115 and the second well 120, although other locations of the mask edge 135 relative to the interface 140 are contemplated herein.

Figure 6:
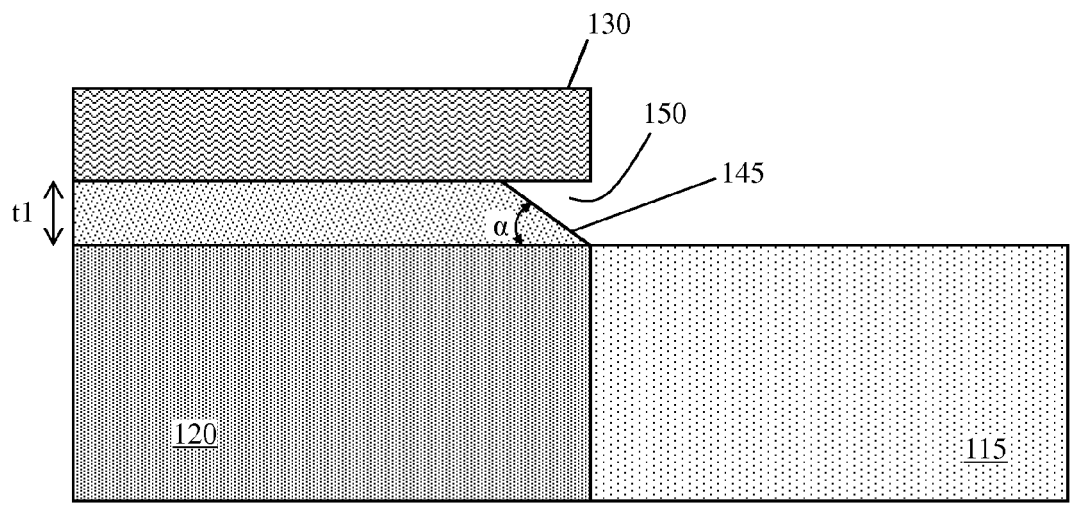

As shown in FIG. 6, a portion of the first layer 125 is removed and a tapered surface 145 is formed on a remaining portion of the first layer 125. In embodiments, an etch process is used that completely removes a portion of the first layer 125 that is not covered by the mask 130, and that also forms an undercut 150 under the mask 130 resulting in the tapered surface 145. The tapered surface 145 is arranged at an angle α relative to the horizontal upper planar surface of the substrate 110 at the first well 115 and the second well 120.

In accordance with aspects of the invention, the angle α of the tapered surface 145 is controlled based on the thickness t1 of the first layer 125 and the etch process used to remove the portions of the first layer 125. The angle α is greater than 0 degrees and less than 90 degrees relative to the planar upper surface of the substrate 110. In this manner, the tapered surface 145 is sloped at an acute angle relative to the planar upper surface of the substrate 110. In embodiments, the angle α ranges from 3 to 62 degrees, preferably from 18 to 21 degrees, and more preferably is about 20 degrees. The etch process may comprise a buffered hydrofluoric acid (BHF) etch, a chemical oxide removal (COR) etch, or a combination of both, in which the process parameters of the etch are configured to completely remove the first layer 125 in unmasked areas and to form the tapered surface 145 having the desired angle α.

The COR etch process employs etching with gaseous reactants comprising HF and $NH_3$. As the gaseous reactants contact the silicon oxide surface, a film of reaction products is formed on the silicon oxide by adsorption or condensation of the reactant gases on the silicon oxide surface at a pressure near the vapor pressure. The COR etch process etches silicon oxide from a wafer by admitting reactant vapor to a chamber which forms a film on a wafer. Etching is adjusted by controlling the film as well as chamber temperature. After etching is completed, the resulting residue can be removed by thermal desorption. The process parameters of a COR etch (e.g., film temperature, chamber temperature, reactants) may be configured to remove a target thickness of oxide. In embodiments, the tapered surface 145 is created, and the angle α is controlled, by configuring the process parameters of a COR etch to remove a target thickness of oxide that is greater than the thickness t1 of the first layer 125. In one example, a COR etch that is configured to remove 165 Å is applied to a first layer 125 comprising thermally grown oxide having a thickness t1 of 120 Å, with the result being a tapered surface 145 having an angle α of 20 degrees.

The BHF etch process is a wet etch process that employs a mixture of a buffering agent, such as ammonium fluoride ($NH_4F$), and hydrofluoric acid (HF). The process parameters of a BHF etch that affect the etch rate include, for example, the buffering agent, the ratio of buffering agent to HF, the temperature, and the etch time. In embodiments, the process parameters of a BHF etch are selected to achieve a desired angle α at the tapered surface 145. In one example, the first layer 125 comprises thermally grown oxide having a thickness t1 of 134 Å, and a 500:1 BHF is applied for 720 seconds, with the result being a tapered surface 145 having an angle α of 16 degrees.

Table 1 shows various etch processes that have been discovered to provide a tapered surface 145 having an angle α as shown in FIG. 6. The left column indicates the thickness t1 and method of forming the first layer 125. The middle column indicates the etch process. For example, in the middle column, "165 Å COR" indicates a COR etch that is configured to remove 165 Å of oxide. The right column indicates the angle α as shown in FIG. 6.

TABLE 1

| Gate Dielectric | Etch Process | Angle α |
| --- | --- | --- |
| 119 Å thermal oxide | 780 second 500:1 BHF | 3° |
| 119 Å thermal oxide | 165 Å COR | 18° |
| 119 Å thermal oxide | 150 Å COR | 21° |
| 119 Å thermal oxide | 390 second 500:1 BHF at low temperature followed by 75 Å COR | 21° |
| 51 Å thermal oxide and 400 Å TEOS oxide | 960 second 500:1 BHF | 9° |
| 51 Å thermal oxide and 400 Å TEOS oxide | 660 second 500:1 BHF followed by 150 Å COR | 19° |
| 51 Å thermal oxide and 400 Å TEOS oxide | 47 second 8:5:1 BHF | 62° |

Using the data in Table 1, or by developing similar data, the angle α may be predefined for a design and the etch process can be tailored based on the starting thickness of the first layer 125 to produce the predefined angle α. In this manner, the angle α may be selectively chosen and fabricated to suit a particular device design.

Figure 7:
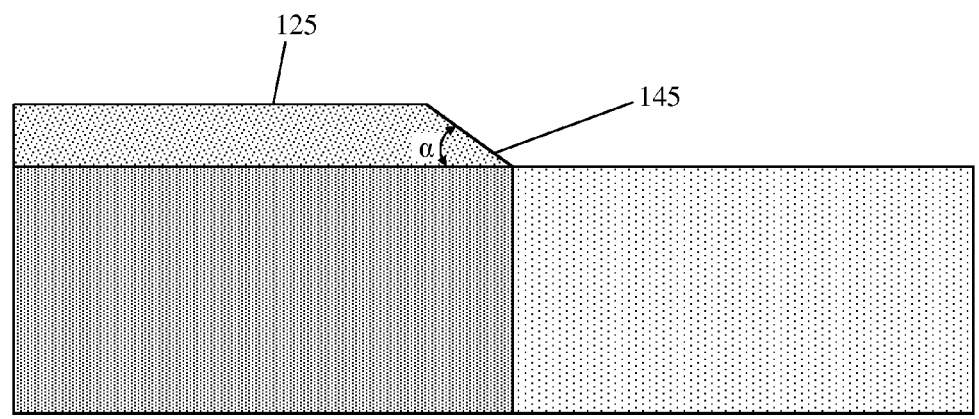

As shown in FIG. 7, the mask is removed after the etching that forms the tapered surface 145 having the angle α in the first layer 125. The mask may be removed using conventional techniques, such as ashing or stripping.

Figure 8:
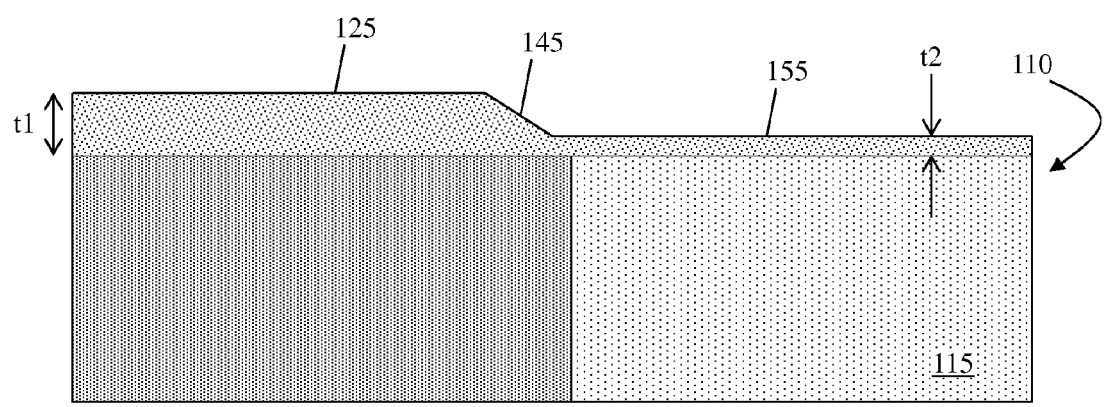

As shown in FIG. 8, a second layer 155 of gate dielectric material is formed at the upper surface of the substrate 110 over the first well 115. According to aspects of the invention, the second layer 155 is composed of the same material and formed using a similar process as the first layer 125, but with a thickness t2 that is less than the thickness t1. For example, in one embodiment the first layer 125 and the second layer 155 each comprises thermally grown oxide ($SiO_2$), the thickness t1 is about 120 Å, and the thickness t2 is about 35 Å. As depicted in FIG. 8, the second layer 155 intersects the tapered surface 145, such that the tapered surface 145 forms a transition surface between a planar upper surface of the first layer 125 and a planar upper surface of the second layer 155.

Figure 9:
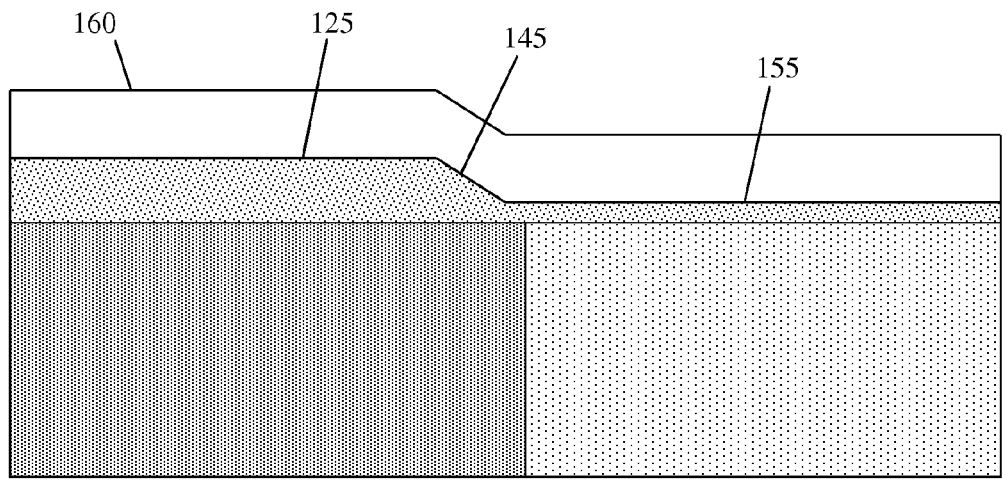

As shown in FIG. 9, a layer 160 of gate conductor material is formed on the upper surfaces of the first layer 125 and the second layer 155, including on the tapered surface 145. The layer 160 of gate conductor material may be formed using conventional semiconductor materials and processes. For example, the layer 160 of gate conductor material may comprise a silicon containing material such as polysilicon that is formed using a chemical vapor deposition (CVD) process. The thickness of the layer 160 of gate conductor material may be from about 60 nm to about 400 nm, and preferably from about 100 nm to about 300 nm.

Figure 10:
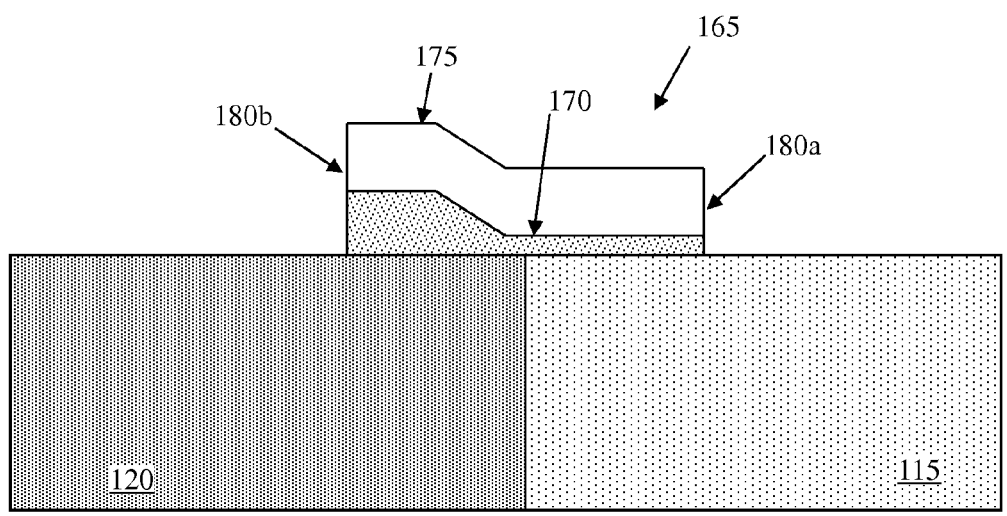

As shown in FIG. 10, the layer 160, the first layer 125, and the second layer 155 are patterned to form a gate 165 comprising a gate dielectric 170 and a gate conductor 175. The patterning can be performed using conventional photolithographic masking and etching processes, such as reactive ion etching (RIE). The patterning is controlled such that the gate 165 has a first sidewall 180a over the first well 115 and a second sidewall 180b over the second well 120, and such that the gate dielectric 170 straddles the interface between the first well 115 and the second well 120.

Figure 11:
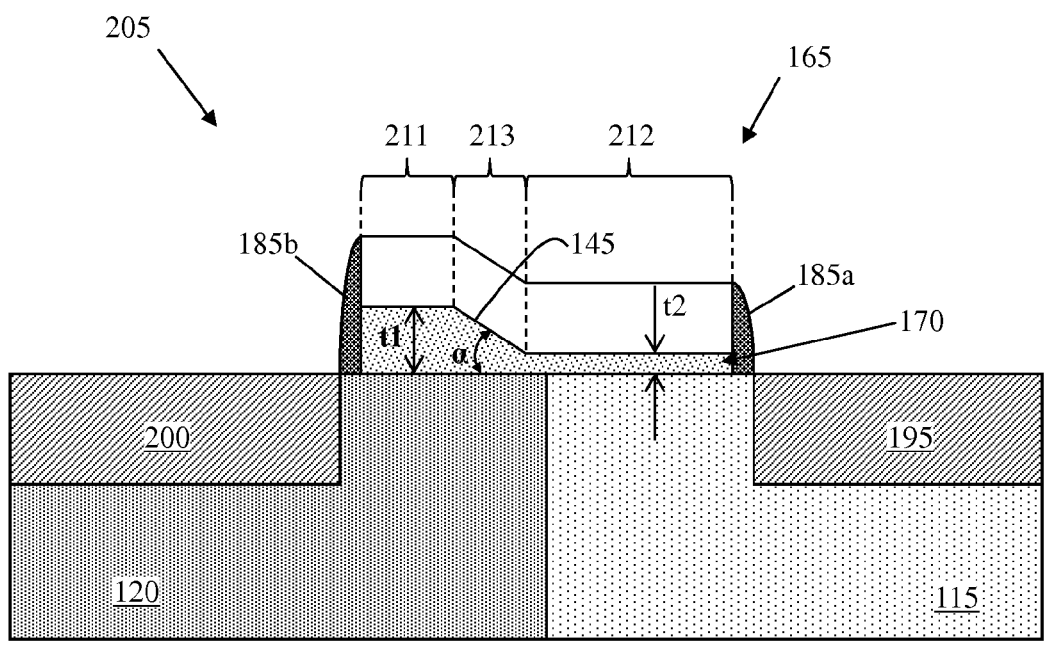

As shown in FIG. 11, sidewall spacers 185a and 185b are formed on the sidewalls of the gate 165. The sidewall spacers 185a and 185b may be formed using conventional semiconductor materials and processes. For example, the sidewall spacers 185a and 185b may be formed by a conformal deposition of a nitride layer followed by an anisotropic reactive ion etch.

As additionally shown in FIG. 11, a source region 195 is formed in the first well 115 and a drain region 200 is formed in the second well 120. The source region 195 and drain region 200 may be formed using conventional masking and ion implantation processes. The source region 195 and drain region 200 are of the same conductivity type as the second well 120 and have a higher dopant concentration relative to the second well 120. For example, the second well 120 may have a dopant concentration from about $1.0 \times 10^{16}/cm^3$ to about $3.0 \times 10^{19}/cm^3$, and the source region 195 and drain region 200 may have a dopant concentration from about $3.0 \times 10^{17}/cm^3$ to about $3.0 \times 10^{21}/cm^3$, although other concentrations may be used.

With continued reference to FIG. 11, the resultant structure comprises an LDMOS FET 205 comprising the gate 165, source region 195, drain region 200, a drift region in the second well 120, and a channel region in the first well 115. The gate dielectric 170 of the LDMOS FET 205 comprises a first portion 211 having a uniform first thickness t1 formed over the second well 120, a second portion 212 having a uniform second thickness t2 formed over the first well 115, and transition portion 213 with a tapered surface 145 that provides a transition from the upper surface of the first portion 211 to the upper surface of the second portion 212. In this manner, a relatively thick portion of the gate dielectric is provided as the drain side of the device, and a relatively thin portion of the gate dielectric is provided at the source side of the device. In embodiments, the first portion 211 has a uniform thickness due to its planar upper surface being essentially parallel to the upper surface of the substrate 110, the second portion 212 has a uniform thickness due to its planar upper surface being essentially parallel to the upper surface of the substrate 110, and the transition portion 213 has a non-uniform thickness due to its upper surface being at an acute angle relative to the upper surface of the substrate 110.

In an exemplary implementation, the LDMOS FET 205 of FIG. 11 is a 5 V device meaning that 10 V is applied at the drain 200, e.g., via a drain contact (not shown). In this implementation, the thickness t1 is about 120 Å, the thickness t2 is about 35 Å, and the angle α is about 18 to 21 degrees. In this manner, the device can be switched using a gate voltage of about 1.8 V due to the relatively thin gate dielectric 170 in the second portion 212, while the device can operate with 5 V applied at the drain due to the relatively thick gate dielectric 170 in the first portion 211.

In another exemplary implementation, the LDMOS FET 205 of FIG. 11 is a 50 V device meaning that 50 V is applied at the drain 200, e.g., via a drain contact (not shown). In this implementation, the thickness t1 is about 515 Å, the thickness t2 is about 120 Å, and the angle α is about 18 to 21 degrees. In this manner, the device can be switched using a gate voltage of about 5 V due to the relatively thin gate dielectric 170 in the second portion 212, while the device can operate with 50 V applied at the drain due to the relatively thick gate dielectric 170 in the first portion 211.

Still referring to FIG. 11, according to aspects of the invention the gate dielectric 170 is formed on the planar upper surface of the substrate 110 including coplanar upper surfaces of the first well 115 and the second well 120. Moreover, the LDMOS FET 205 is formed without a field oxide (field plate), and without a bird's beak of oxide, both of which result in larger sized devices relative to implementations of the invention. Even further, in embodiments, the first (thick) portion 211 and the second (thin) portion 212 are composed of the same material (e.g., thermally grown $SiO_2$), such that there is not an interface of differing dielectric materials that could render a device effectively inoperable.

In accordance with aspects of the invention, the use of a tapered transition surface (e.g., tapered surface 145) rather than a step transition (e.g., step 60 of FIG. 2) reduces the peak electric field generated in the device, and thus improves breakdown voltage characteristics of the device. For example, the peak electric field at a step transition (e.g., step 60 of FIG. 2) can be about $3.3e^6$ V/cm at the sharp corner of the step transition, whereas the peak electric field for a similar device with a sloped transition (e.g., tapered surface 145) can be about $2.9e^6$ V/cm, which represents a 12% decrease in peak electric field.

Figure 12:
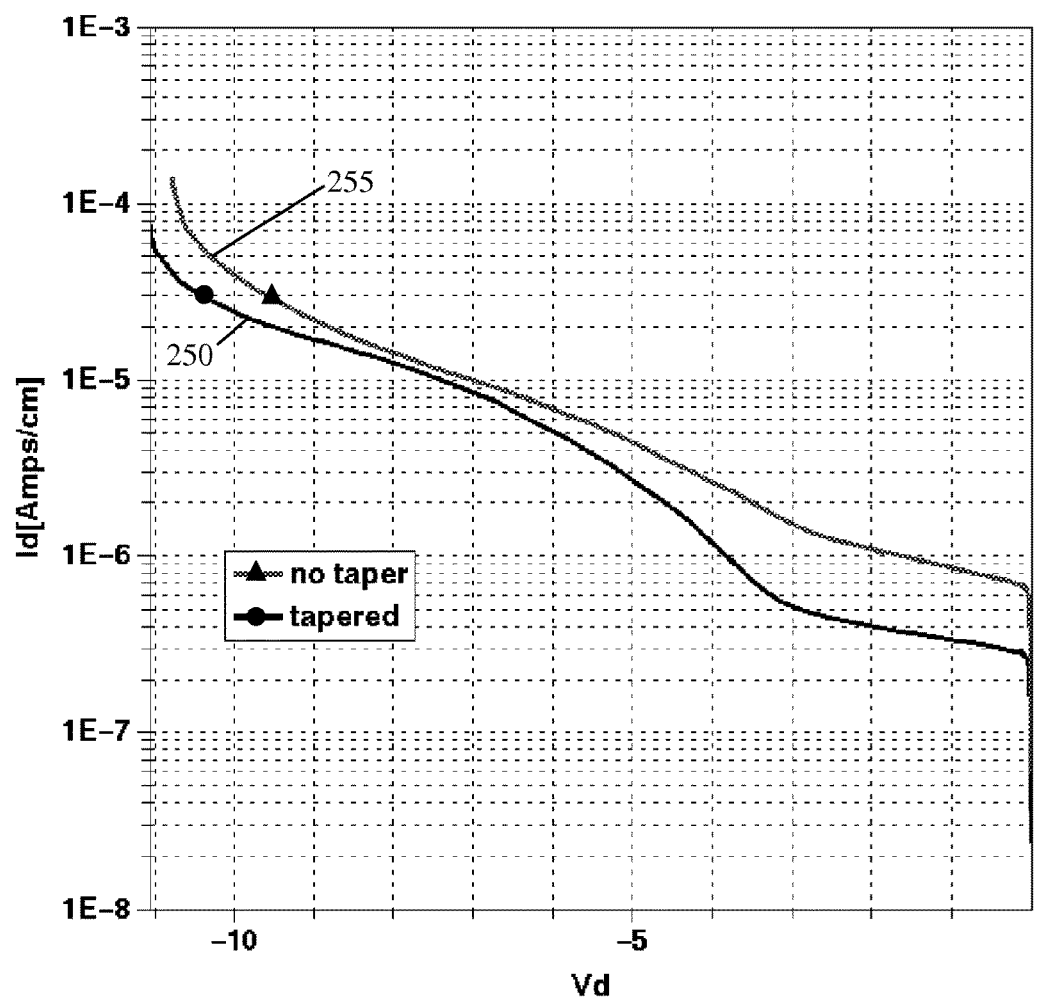
FIG. 12 shows a performance graph of a device manufactured in accordance with aspects of the invention.

FIG. 12 shows a performance graph of a device manufactured in accordance with aspects of the invention. Specifically, FIG. 12 shows a graph of breakdown voltage on the horizontal axis and current density on the vertical axis. Curve 250 represents the performance of a device manufactured according to aspects herein, e.g., LDMOS FET 205 comprising a gate oxide having a thick region, and thin region, and a tapered surface between the thick region and the thin region. Curve 255 represents the performance of a device manufactured with a step transition between a thick gate oxide region and a thin gate oxide region (e.g., as in FIG. 2). As shown in FIG. 12, the device manufactured according to aspects of the invention (curve 250) has a higher breakdown voltage at any given current density compared to the device manufactured with a step transition (curve 255). Accordingly, implementations of the invention provide a design that advantageously improves breakdown voltage while providing the same on-resistance (Ron) compared to a similarly structure device having a step transition.

Figure 13A:
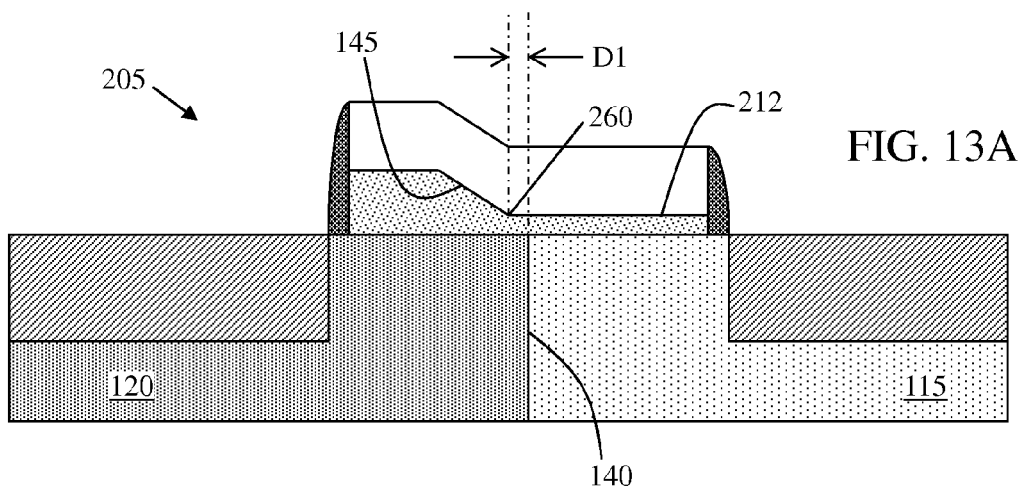
FIGS. 13A-C show alternative structures and respective processing steps in accordance with aspects of the invention.
Figure 13B:
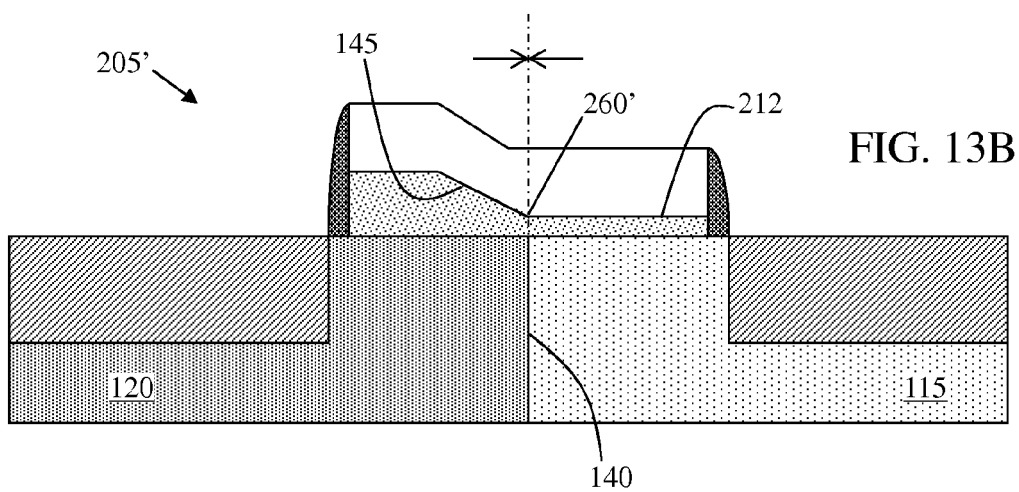
Figure 13C:
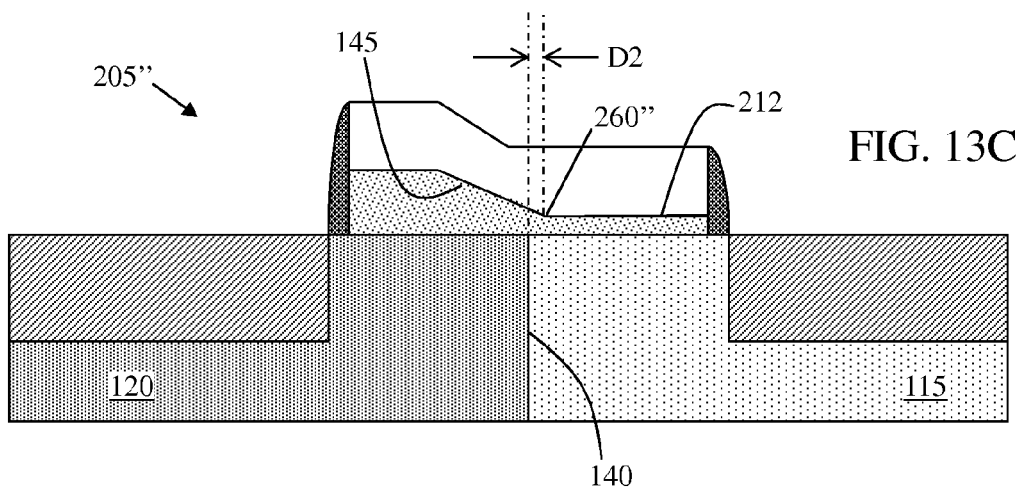

FIGS. 13A-C show alternative structures and respective processing steps in accordance with aspects of the invention. Specifically, FIGS. 13A-C illustrate that the spatial location of the intersection of the tapered surface 145 and the upper surface of the thin region 212 of the gate dielectric may be tailored relative to the interface of the first well 115 and the second well 120. As shown in FIG. 13A, the device 205 is structured and arranged such that the intersection 260 is laterally offset (e.g., in the horizontal direction) from the interface 140 by an amount "D1" such that the intersection 260 is over the second well 120. As shown in FIG. 13B, the device 205' is structured and arranged such that the intersection 260' aligned with the interface 140. As shown in FIG. 13C, the device 205" is structured and arranged such that the intersection 260" is laterally offset from the interface 140 by an amount "D2" such that the intersection 260" is over the first well 115. According to aspects of the invention, the location of the intersection relative to the interface between the wells may be tailored to tune the breakdown voltage of the LDMOS device.

Figure 14:
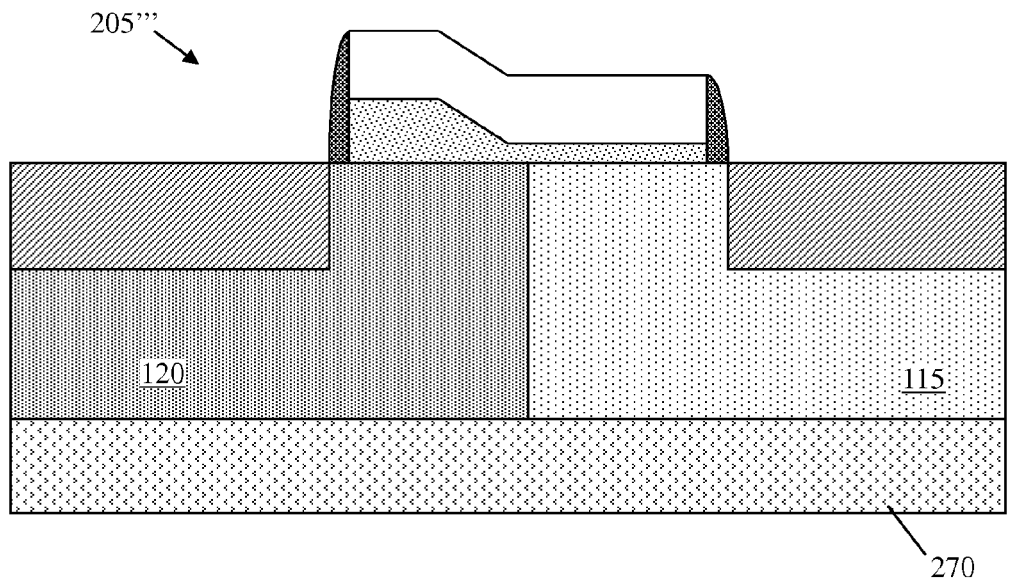
FIG. 14 shows an alternative structure and respective processing steps in accordance with aspects of the invention.

FIG. 14 shows an alternative structure and respective processing steps in accordance with aspects of the invention. Specifically, FIG. 14 shows the device 205''' in which the first well 115 and the second well 120 are formed on and abutting a buried oxide layer 270. The device 205''' may be formed using the same processing steps as described with respect to FIGS. 4-11 after initially forming the first well 115 and the second well 120 on the buried oxide layer 270. The buried oxide layer 270 may be, for example, the insulator layer of an SOI substrate, silicon on sapphire substrate, gallium nitride substrate, or silicon nitride substrate, such that aspects described herein may be implemented using an alternative to a bulk silicon substrate.

Figure 15:
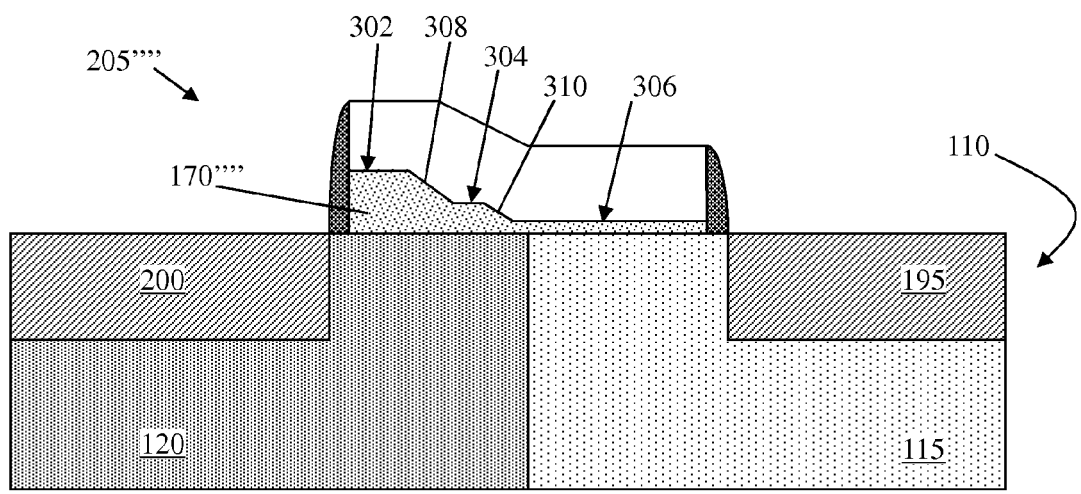
FIGS. 15-18 show an alternative structures and respective processing steps in accordance with aspects of the invention.

FIG. 15 shows an alternative structure and respective processing steps in accordance with aspects of the invention. Particularly, FIG. 15 shows the device 205'''' in which the gate dielectric 170'''' has three regions of uniform thickness and two tapered surfaces between the regions. Specifically, the gate dielectric 170'' includes a first region 302 having a uniform first thickness measured vertically from the planar upper surface of the substrate 110. The gate dielectric 170'''' also includes a second region 304 having a uniform second thickness measured vertically from the planar upper surface of the substrate 110. The gate dielectric 170'''' also includes a third region 306 having a uniform third thickness measured vertically from the planar upper surface of the substrate 110.

Still referring to FIG. 15, the first region 302 is formed closest to the drain 200 (e.g., over the second well 120). The third region 306 is formed closest to the source 195 (e.g., over the first well 115). The second region 304 is between the first region 302 and the third region 306. A first tapered surface 308 extends from an upper surface of the first region 302 to an upper surface of the second region 304 at a non-zero angle relative to planar upper surface of the substrate 110. A second tapered surface 310 extends from an upper surface of the second region 304 to an upper surface of the third region 306 at a non-zero angle relative to planar upper surface of the substrate 110.

With continued reference to FIG. 15, the gate dielectric 170'''' may be formed using processes described herein. For example, the gate dielectric 170'''' may be formed by: forming a first layer of gate dielectric material corresponding to the thickness of the first region 302; masking and etching the first layer to provide the first tapered surface 308; forming a second layer of gate dielectric material corresponding to the thickness of the second region 304; masking the first layer and the second layer and etching the second layer to provide the second tapered surface 310; and forming a third layer of gate dielectric material corresponding to the thickness of the third region 306. For example, in a particular exemplary implementation, the gate dielectric 170'''' may be formed by a sequence of steps including: a 45-55 Å thermal oxidation; a 390-410 Å LPCVD TEOS oxide deposition; forming and patterning a first mask; etching first with 500:1 BHF then with 125 Å COR; stripping the first mask and cleaning; a 105-115 Å thermal oxidation; forming a patterning a second mask; etching with 150 Å COR; stripping the second mask and cleaning; a 30-40 Å thermal oxidation. The other processing steps may be similar to those described with respect to FIGS. 3-11.

In an exemplary implementation, the LDMOS FET 205'''' of FIG. 15 is a 50 V device meaning that 50 V is applied at the drain 200, e.g., via a drain contact (not shown). In this implementation, the thickness of the first region 302 is about 515 Å, the thickness of the second region 304 is about 120 Å, and thickness of the third region 304 is about 35 Å. The angle of the first tapered surface 308 relative to the horizontal upper surface of the substrate 110 is between 9 and 62 degrees, and the angle of the second tapered surface 310 relative to the horizontal upper surface of the substrate 110 is between 3 and 23 degrees. In this manner, the device can be switched using a gate voltage of about 1.8 V due to the relatively thin gate dielectric in the third region 304, while the device can operate with 50 V applied at the drain due to the relatively thick gate dielectric at the first region 302.

Figure 16:
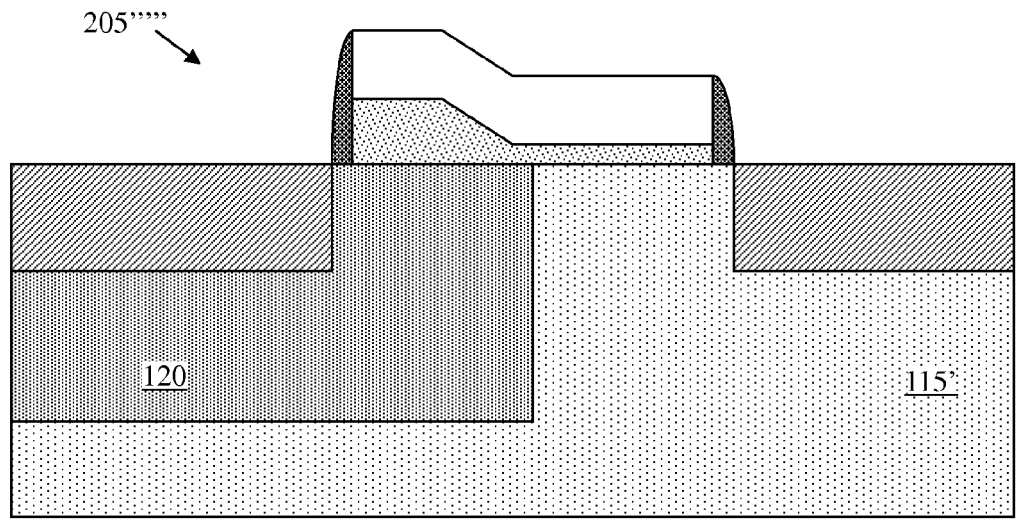

FIG. 16 shows an alternative structure and respective processing steps in accordance with aspects of the invention. Particularly, FIG. 16 shows the device 205''''' in which the first well 115' extends underneath the second well 120, as opposed to the device 205 of FIG. 11 in which the first well 115 and the second well 120 have essentially a same depth.

Figure 17:
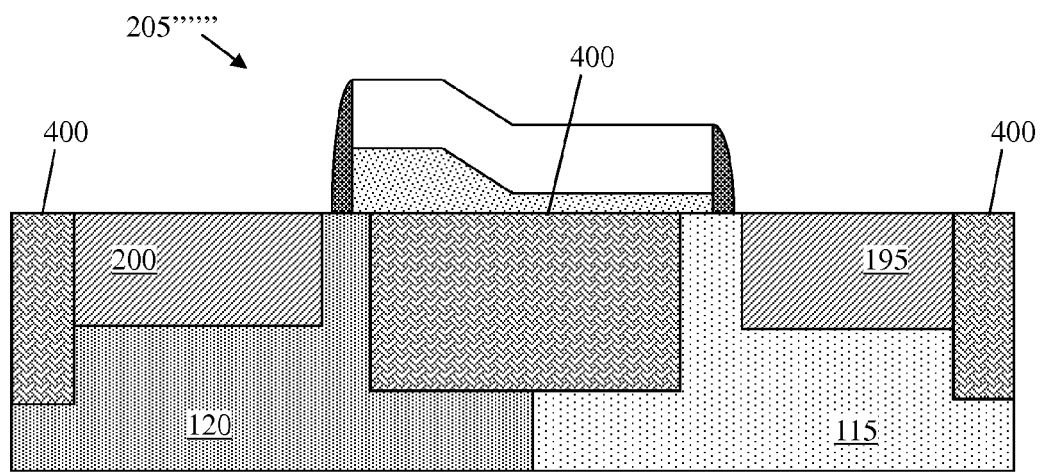

FIG. 17 shows an alternative structure and respective processing steps in accordance with aspects of the invention. Particularly, FIG. 17 shows the device 205'''''' including (STI) structures 400. In embodiments, first and second STI structures 400 are formed in the substrate abutting the first well 115, the second well 120, the source 195, and the drain 120. In embodiments, a third STI structure 400 is centrally located between the first well 115 and the second well 120 and beneath the gate, which forces the current flow deeper into the substrate. The STI structures 400 may be formed using conventional semiconductor fabrication processes and materials (e.g., masking, etching, deposition, etc.). The STI structures 400 may be used with any of the embodiments described herein, including the bulk silicon implementation (FIG. 11), SOI implementation (FIG. 14), dual taper implementation (FIG. 15), and alternate well implementation (FIG. 16). The STI structures 400 may be formed at any suitable step in the process flow, such as prior to forming the first well and the second well, for example.

Figure 18:
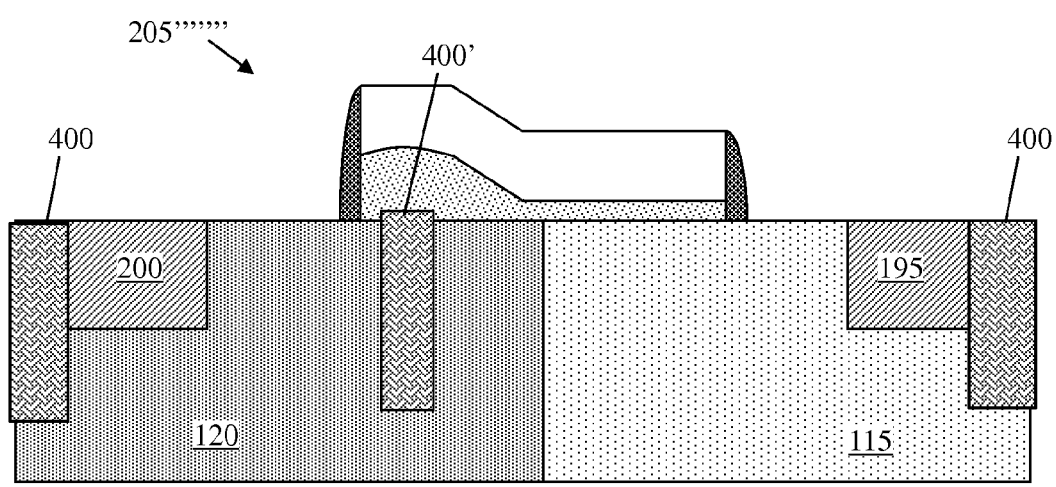

FIG. 18 shows an alternative structure and respective processing steps in accordance with aspects of the invention. Particularly, FIG. 18 shows the device 205''''''' including (STI) structures 400 similar to the device of FIG. 17. In embodiments, the central STI structure 400' is located under the thicker portion of the gate oxide and enhances a thickness of the thicker portion of the gate oxide. In embodiments, when forming the central STI structure 400', a planarizing step may leave a portion of the central STI structure 400' extending above (higher than) an upper surface of the substrate. This high portion of the central STI structure 400' bumps up the thickness of the thicker portion of the gate oxide, and thus enhances the thickness of the gate oxide in this region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a channel region in a first well in a substrate;
   a drift region in a second well in the substrate;
   a gate dielectric comprising:
      a first portion having a first planar upper surface and first uniform thickness;
      a second portion having a second planar upper surface and a second uniform thickness different than the first uniform thickness; and
      a transition portion having tapered surface extending from the first portion to the second portion,
   wherein the gate dielectric is on a planar upper surface of the substrate, and
   the tapered surface is at an acute angle relative to the upper surface of the substrate,
   further comprising a shallow trench isolation structure that abuts each of the first well, the second well, and a bottom surface of the gate dielectric,
   wherein the gate dielectric comprises a flat bottom surface that contacts the shallow trench isolation structure, the first well, and the second well, and
   the shallow trench isolation structure comprises a flat uppermost surface that contacts the flat bottom surface of the gate dielectric.

2. The structure of claim 1, wherein the tapered surface extends from the first planar upper surface to the second planar upper surface.

3. The structure of claim 1, wherein:
   the first uniform thickness is greater than the second uniform thickness; and
   the first portion is on a drift region of a laterally diffused metal oxide semiconductor (LDMOS) device.

4. The structure of claim 3, wherein the second portion is on the channel region of the LDMOS device, and further comprising:
   a gate conductor on the gate dielectric;
   a source region abutting the channel region; and
   the drain region abutting the drift region.

5. The structure of claim 1, wherein the gate dielectric is part of a laterally diffused metal oxide semiconductor (LDMOS) field effect transistor (FET) that is formed without a field oxide.

6. The structure of claim 3, further comprising a gate conductor on and covering an entirety of an uppermost surface of the first portion.

7. The structure of claim 1, further comprising:
   a gate conductor on and covering the first portion, the second portion, and the transition portion; and
   sidewall spacers contacting vertical sidewalls of the gate conductor and the gate dielectric.

8. The structure of claim 1, wherein the flat uppermost surface of the shallow trench isolation structure is coplanar with an upper surface of the first well and an upper surface of the second well.

9. The structure of claim 8, further comprising:
   a gate conductor on and covering the first portion, the second portion, and the transition portion of the gate dielectric;
   a first sidewall spacer contacting first vertical sidewalls of the gate conductor and the gate dielectric; and
   a second sidewall spacer contacting second vertical sidewalls of the gate conductor and the gate dielectric.

10. A semiconductor structure, comprising:
    a channel region in a first well in a substrate;
    a drift region in a second well in the substrate;
    a source region in the substrate and abutting the channel region;
    a drain region in the substrate and abutting the drift region;
    a gate dielectric comprising:
       a thin portion on the channel region;
       a thick portion on the drift region; and
       a transition region having tapered surface extending from the thin portion to the thick portion,
    wherein the gate dielectric is on a planar upper surface of the substrate, and
    the tapered surface is at an acute angle relative to the upper surface of a substrate,
    further comprising a shallow trench isolation structure that abuts each of the first well, the second well, and a bottom surface of the gate dielectric,
    wherein the shallow trench isolation structure abuts and extends underneath each of the thick portion, the thin portion, and the transition region,
    the gate dielectric comprises a flat bottom surface that contacts the shallow trench isolation structure, the first well, and the second well, and
    the shallow trench isolation structure comprises a flat uppermost surface that contacts the flat bottom surface of the gate dielectric, and that is coplanar with an upper surface of the first well and an upper surface of the second well.

* * * * *